United States Patent [19]

Martens et al.

[11] 4,081,573
[45] Mar. 28, 1978

[54] METHOD FOR PREPARING SUPERCONDUCTIVE $Nb_3Sn$ LAYERS ON NIOBIUM SURFACES FOR HIGH-FREQUENCY APPLICATIONS

[75] Inventors: Hans Martens; Bernhard Hillenbrand, both of Erlangen, Germany

[73] Assignee: Siemens Aktiengesellschaft, Munich, Germany

[21] Appl. No.: 705,418

[22] Filed: Jul. 15, 1976

[30] Foreign Application Priority Data

Jul. 21, 1975 Germany ............... 2532570

[51] Int. Cl.² ........................ C23C 13/02
[52] U.S. Cl. ........................ 427/62; 29/599; 118/48; 118/49; 228/263; 331/96; 331/107 S; 427/250; 427/295; 427/124
[58] Field of Search ............ 331/107 S, 96; 427/62, 427/250, 295, 124; 228/263; 29/599; 118/48, 49

[56] References Cited

U.S. PATENT DOCUMENTS

| | | | |
|---|---|---|---|
| 3,085,913 | 4/1963 | Caswell | 427/250 |
| 3,213,825 | 10/1965 | Cooper et al. | 118/49 |
| 3,332,800 | 7/1967 | Saur | 427/62 |
| 3,346,467 | 10/1967 | Allen | 29/599 |
| 3,468,021 | 9/1969 | Maier | 29/599 |
| 3,493,809 | 2/1970 | Weissman | 29/599 |
| 3,533,919 | 10/1970 | Prior | 427/250 |
| 3,576,670 | 4/1971 | Hammond | 427/250 |
| 3,661,639 | 5/1972 | Caslaw | 427/62 |

OTHER PUBLICATIONS

Hillenbrand et al., "Superconducting $Nb_3Sn$–Cavities," IEEE Transactions on Magnetics, vol. MAG-II, No. 2, Mar. 1975.

*Primary Examiner*—Ralph S. Kendall
*Assistant Examiner*—John D. Smith
*Attorney, Agent, or Firm*—Kenyon & Kenyon, Reilly, Carr & Chapin

[57] ABSTRACT

A method for preparing superconductive $Nb_3Sn$ layers on niobium surfaces for high frequency applications in which a defined reaction zone which contains a tin source and the niobium surface is formed in an open reaction chamber and sealed off to the extent that, while interfering gases are being drawn off from the reaction zone during the evacuation, the vapor pressure of the tin remains higher within the reaction zone, when heated, than in the rest of the chamber. While pumping continuously, the reaction zone is then heated to a temperature between 930° and 1400° C and held at this temperature until an $Nb_3Sn$ layer 0.5 to 5 μm thick is formed on the niobium surface.

11 Claims, 4 Drawing Figures

METHOD FOR PREPARING SUPERCONDUCTIVE NB₃SN LAYERS ON NIOBIUM SURFACES FOR HIGH-FREQUENCY APPLICATIONS

BACKGROUND OF THE INVENTION

This invention relates a method for preparing superconductive Nb₃Sn layers on niobium surfaces for high frequency applications in general and more particularly to an improved method of this type.

Superconducting apparatus for operation with high frequency electromagnetic fields at frequencies of about 10 MHz and higher can have many technical applications. In particular, such apparatus can be used as resonators and separators for particle accelerators or as high frequency resonators for other purposes, for instance, as frequency standards. For this purpose they can be designed as cavity resonators or resonator helices. Superconducting cavity resonators are operated in the frequency range of about 1 to 15 GHz and resonator helices in the range around 100 MHz. Primary niobium and occasionally also lead have heretofore been used as superconductor materials for such resonators.

In such superconducting apparatus, it is desired to have a large Q factor and also, as a rule, the highest possible critical magnetic flux density $B_c^{ac}$ as measured under the influence of high frequency fields, in order to operate the superconducting apparatus with as little high frequency power as possible and, at the same time, have a low surface resistance. For, if the critical magnetic flux density $B_c^{ac}$ is exceeded, the losses increase steeply, the surface resistance increases considerably and the electromagnetic field breaks down. An upper limit for $B_c^{ac}$ is given in such cases by what is known as the thermodynamic critical flux density $B_c$. Since the critical thermodynamic flux density $B_c$ of Nb₃Sn is higher than that of niobium, it stands to reason that a higher critical flux density $B_c^{ac}$ can be achieved at an Nb₃Sn surface than at the niobium surface. In addition, Nb₃Sn also has a considerably higher critical temperature than niobium, so that it has, on the one hand, greater thermal stability and, on the other hand, should also permit higher operating temperatures than niobium, particularly for operation at the temperature of boiling liquid helium of 4.2 K, which is already too high for high frequency applications of niobium.

There have been previous attempts at applying thin protective layers of Nb₃Sn on niobium resonators by first evaporating tin on the niobium resonator and then heat treating the resonator. With such surface layers, a $Q_o$ of about $10^9$ and a critical flux density $B_c^{ac}$ of about 25 mT were measured at 2.8 GHz (cf. "Siemens-Forschungs-und Entwicklungsberichte" 3 (1974), pages 90 to 99).

With such a procedure, however, a difficulty is encountered in that the evaporated tin melts at the beginning of the heat treatment and can run, for instance, where the interior of a cavity resonator is being coated, along the interior surface to the lowest point of the cavity, before enough tin for the formation of a sufficiently thick Nb₃Sn layer has been diffused into the niobium surface. Therefore, in practice only very thin tin layers can be vapor deposited and the evaporation and subsequent heat treatment must be repeated several times before a sufficient amount of tin for forming the Nb₃Sn layer can diffuse into the niobium surface.

It has also been proposed to expose the niobium parts which are to be provided with an Nb₃Sn layer to a tin vapor atmosphere, from which the tin diffuses into the niobium surface, forming the desired Nb₃Sn layer, in a closed reaction vessel, i.e., a sealed quartz ampoule, at an elevated temperature of about 1000° C. Thereby, Nb₃Sn layers of a thickness of several micrometers with relatively good properties, e.g., $Q_o$ values of about $10^9$ and critical magnetic flux densities $B_c^{ac}$ of somewhat over 40 mT, can be obtained (See the paper by Hillenbrand et al in "IEEE Transactions of Magnetics," vol. MAG-11, No. 2, Mar. 1975, Pages 420 to 422).

SUMMARY OF THE INVENTION

It is an object of the present invention to further simplify and improve the preparation of superconductive Nb₃Sn layers on niobium surfaces for high frequency applications. In addition, it is an object to obtain a further increase of the Q and the critical magnetic flux density of the Nb₃Sn layers produced.

To solve this problem, the procedure used according to the present invention for preparing superconductive Nb₃Sn layers on niobium surfaces is as follows: in a reaction chamber that can be evacuated, a reaction zone which is set apart from the rest of the volume of the chamber and contains a tin source and the niobium surface to be provided with the Nb₃Sn, is formed and sealed from the rest of the chamber volume to the extent that, while gases present or being produced within the reaction zone are drawn off when the reaction chamber is evacuated, the tin vapor pressure within the reaction zone remains higher during the later heating period than the tin vapor pressure in the rest of the chamber; and while the reaction chamber is pumped continuously, the reaction zone is heated to a temperature between 930° and about 1400° C and is held at this temperature until an Nb₃Sn layer between 0.5 and 5μm thick is formed on the niobium surface.

The method according to the present invention, which uses an open reaction chamber, has numerous advantages over working in a sealed reaction ampoule. First of all, an open reaction chamber can be used over again and again, while sealed reaction ampoules must generally be destroyed when they are opened. This is a substantial disadvantage particularly in the case of relatively large ampoules, such as are necessary for the coating of larger niobium parts. In addition, the gases which are liberated from the surface of the heated parts in the course of being heated up and leave the heated parts are continuously pumped off in the procedure with an open ampoule in accordance with the present invention while, when working with a sealed ampoule, the gases generated during or after the sealing remain enclosed in the ampoule. This can frequently be a great disadvantage since such gases can lead to disturbances of the Nb₃Sn layer. However, the quality of this Nb₃Sn surface is of decisive importance since the depth of penetration of the high frequency currents and fields into the superconductor surface is only about 0.1 to 0.2 μm. By forming the reaction zone which is sealed from the rest of the volume of the reaction chamber, it is possible to maintain a tin vapor pressure sufficient for the formation of the Nb₃Sn layer in a relatively short time within this reaction zone, even though the reaction chamber is open and to avoid too much tin being diffused off in the direction toward the cold end of the reaction chamber and the pump connected there.

The desired layer thickness of the Nb$_3$Sn layers of the 0.5 to 5 μm is chosen so that the layers are, on the one hand, thick enough so that the electromagnetic fields and currents penetrate only into the Nb$_3$Sn layer and not into the niobium layer below. Otherwise, particularly the Q and the critical magnetic flux density of the surface would be determined not by the Nb$_3$Sn layer but by the niobium layer underneath. On the other hand, the Nb$_3$Sn layers of the mentioned thickness are so thin that the dissipation heat generated in the Nb$_3$Sn layer can be removed via a very short path into the niobium, the heat conductivity of which is higher than that of the Nb$_3$Sn, and from there into the coolant, which is in contact with the niobium body when the apparatus is in operation. The temperature range between 930° and 1400° C is particularly advantageous for forming Nb$_3$Sn layers, since below 930° C there is danger that undesired tin rich phases of the system niobium-tin will be formed. Above 1400° C, on the other hand, the layer growth can only be poorly controlled.

It is particularly advantageous if the niobium surface which is to be provided with the Nb$_3$Sn layer itself forms a boundary surface of the reaction zone. Then, the remaining surfaces of the niobium body, which are not to be provided with an Nb$_3$Sn layer, can lie outside the reaction zone. In this manner these surfaces will not be covered with an undesired Nb$_3$Sn layer, which would reduce the thermal conductivity of the niobium body.

For defining the reaction zone further, quartz can be used, for instance. However, certain precautions, which will be explained later, should be taken in order to avoid a reaction between tin and the quartz walls and the incorporation of silicon into the Nb$_3$Sn layer. If quartz is used, a reaction temperature of 1050° C should, in particular, not be exceeded.

Such difficulties can be avoided if only niobium surfaces are used to define the reaction zone. One or more of these niobium surfaces may be the surfaces which are to be coated with the Nb$_3$Sn layer. However, it is also possible, for instance, if the outside of a niobium resonator helix is to be provided with an Nb$_3$Sn layer, to place the niobium body to be coated, together with a tin source, into a niobium vessel, which, while sealed against the rest of the reaction chamber, is not completely closed off. If, on the other hand, the inside surface of a niobium cavity is to be provided with an Nb$_3$Sn layer, then the tin source is advantageously brought into the interior of the cavity which then, together with additional parts if necessary, defines the reaction zones.

In order to accelerate the evacuation, particularly in the initial phase, the reaction zone can advantageously be kept open at first during the heating period and sealed off only when an elevated temperature is reached. The reaction zone can preferably be kept open until a temperature of about 400° C is reached. Thereby, the tin, which melts just below 400° C, can still be degassed with the reaction zone open without the tin vapor pressure already being too high. In addition, the gases absorbed at surfaces within the reaction zone, particularly the water vapor, have already separated to a large degree from the surfaces when the temperature of 400° C is reached.

The sealing of the reaction zone is advantageously accomplished in such a manner that the total cross section of the connecting paths between the interior of the sealed reaction zone and the rest of the reaction chamber, i.e., the total leakage cross section of the reaction zone, is smaller than the surface of the tin source, i.e., that surface of the melted tin supply, from which tin evaporates into the reaction zone. With this design of the leakage cross section, only less than half of the evaporating tin can possibly pass from the reaction zone into the reaction chamber. It is particularly advantageous for a further reduction of the tin losses, however, if the total leakage cross section is at most 25% of the surface of the tin source. However, in most cases the total leakage cross section cannot be accurately determined and an estimate must be made. With a total leakage cross section in the order of 0.1 cm$^2$ a very good evacuation of the gases which are present or interfere within the reaction zone is still obtained since they have a substantially lower molecular weight than tin and are therefore pumped off much more rapidly than, for instance, tin vapor.

In addition to being determined by the surface of the tin source and the leakage cross section of the reaction zone, however, the tin vapor pressure is further determined by the size of the niobium surface which is to be provided with the Nb$_3$Sn layer, since the tin diffusing into the niobium surface is removed from the vapor space. So as not to obtain too low a tin vapor pressure in the reaction zone for this reason and thereby require excessively long reaction times, the surface of the tin source should be chosen, if possible, larger than 0.2% but preferably larger than 1% of the niobium surface to be provided with the Nb$_3$Sn layer. Other niobium surfaces that border on the reaction zone also must be taken into consideration to the extent that Nb$_3$Sn layers can form there.

During the heating period and the following reaction time, the reaction chamber naturally should be evacuated as much as possible. It has been found to be advantageous to carry out the pumping off of the reaction chamber and the heating of the reaction zone in such a manner that during the heating period and the reaction time a residual gas pressure in the reaction chamber of 10$^{-4}$ Torr, measured at the cold end which is connected to the pump, is not exceeded, or only exceeded for a brief time.

For heat insulation, a body with low heat conductivity can advantageously be placed in the reaction chamber between the reaction zone and the cold end which is connected to the pump. The temperature distribution within the reaction zone should be as homogeneous as possible, at least during the reaction time, during which the Nb$_3$Sn layer is formed. Preferably, the niobium surface to be coated and the tin source should be at about the same temperature. Of course, in no case should the niobium surface be so much hotter than the tin source that the tin is transported back from the Nb$_3$Sn layer formed on the niobium surface to the tin source instead of from the tin source to the niobium surface. This condition should also be avoided as far as possible during the cooling period after the reaction.

During the heating period, on the other hand, a homogeneous temperature distribution in the reaction zone is less important.

DETAILED DESCRIPTION OF THE INVENTION

Figure 1:
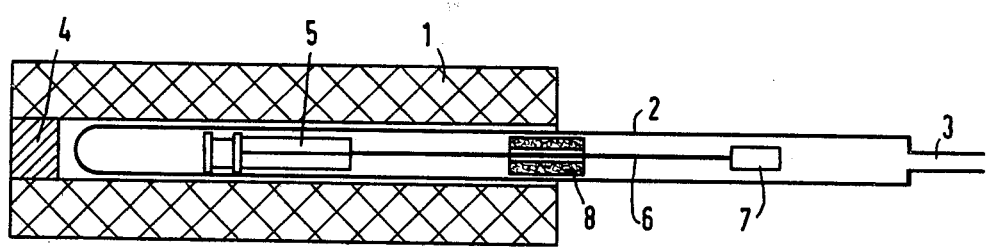
FIGS. 1 and 2 are schematic cross sections of apparatus for one arrangement for carrying out the method according to the present invention.
Figure 2:
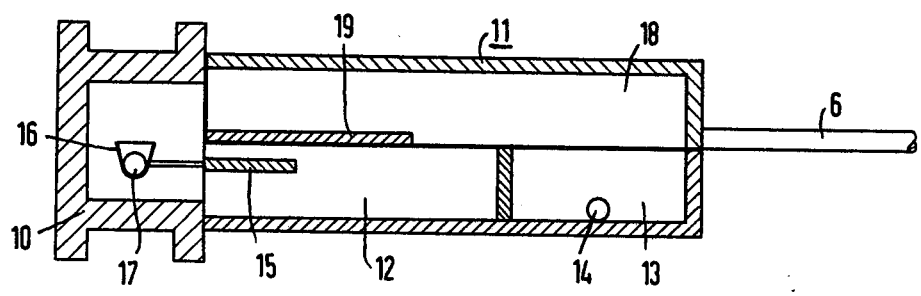

The apparatus shown in FIG. 1 consists essentially of a tubular furnace 1, in which the reaction chamber in the form of a quartz ampoule 2, open on one side, is located. The cold end of the ampoule 2, situated outside the furnace 1, is connected via a pumping stem 3 to a vacuum pump, e.g., a molecular turbo pump. The pumping stem 3 may consist, for instance, of metal and be flanged, with the interposition of indium seals, to the open end of the ampoule 2. This flange connection must be at a low temperature, i.e., about room temperature, since at a point of higher temperature, for instance within the furnace 1, a detachable vacuum tight joint would be practically impossible. The other side of the tubular furnace 1 is closed off with a suitable plug 4 for heat insulation. The sealed reaction zone 5, which will be explained in detail with the aid of FIG. 2, is located to the greatest extent possible in the center of the tubular furnace 1, i.e., in a zone with a temperature as homogeneous as possible. An actuating rod 6, which carries at its cold end a magnetic armature 7, which in turn can be displaced by a magnet arranged outside the ampoule 2 is used for opening and sealing of the reaction zone 5 during the heating period. Approximately at the end of the furnace 1 a body 8 of low heat conductivity is also disposed in the ampoule 2. This body 8 acts as heat insulation and as a radiation shield. Suited for this purpose is, for instance, a quartz ampoule which is evacuated to reduce its heat conduction and is filled with quartz wool as a radiation shield. A central canal through which the actuating rod 6 is brought is also provided in the body 8 of low heat conductivity. The body 8 should not fill the ampoule 2 completely, but must leave a cross section sufficient for evacuating. In order to further reduce the flow resistance during evacuation, the magnetic armature 7 may also be provided with longitudinal holes.

The reaction zone itself is shown in detail in FIG. 2. It is set apart from the rest of the reaction chamber 2 by the interior surface of a cup shaped niobium resonator 10 to be provided with an $Nb_3Sn$ layer and a two piece quartz tube 11, which is closed at one end. In the lower part 12 of the quartz tube 11, a compartment 13 for a tin supply 14 is provided. In the lower part 12 a quartz plate 15, to which a cup shaped holder 16 for a further tin supply 17 is fastened, is also mounted. A quartz plate 19 is led into the upper part 18 of the quartz tube 11. At the upper part 18 the actuating rod 6 is also fastened. The end surfaces of the open end of the quartz tube 11 are ground flat and are advantageously pushed so closely against the niobium resonator 10 that they rest against its end faces sufficiently tightly. In addition, the surfaces at which the upper part 18 and the lower part 12 of the quartz tube 11 are in contact, are ground smooth, so that the upper part 18 can easily slide on the lower part 12, and in addition, a sufficiently tight closing of the interior of the reaction zone against the rest of the reaction chamber is achieved. The upper part 18 of the quartz tube can be retracted by means of the actuating rod 6. Thereby, the interior of the reaction zone 5 can be opened for faster evacuation and, if it is retracted still further, the compartment 13 containing the tin supply 14 can also be closed off by the quartz plate 19. Closing off the tin supply 14 is advisable particularly during the cooling period because of the temperature differences which are then possible between the tin supply 14 and the resonator cup 10. For instance, the tin source 14 might cool down more slowly than the resonator cup 10, which would bring about the danger that splattered tin deposits could form on the inside surface of the resonator.

Of decisive importance for the coating of the inside surface of the resonator cup 10 with this apparatus for carrying out the method according to the present invention, however, is not so much the tin source 14 but the tin source 17 mounted inside the resonator cup 10 itself. Surprisingly, the cup shaped mount 16 of the tin source 17 does not lead to a shielding of the portions of the inside surface of the resonator situated below the mount 16 from the tin source 17. The reason for this is presumably that the tin atoms are scattered repeatedly within the resonator cup. In addition, the tin source 17 has the advantage that the tin atoms evaporating from it predominantly strike the inside surface of the resonator cup 10 before they have touched the walls of the quartz tube 11. The probability of incorporation of silicon into the $Nb_3Sn$ layer formed at the inside surface of the resonator cup 10 is therefore very small. If only the tin source 14 were used, a large part of the tin atoms evaporated from it would get to the inside surface of the resonator cup 10 only after being scattered once or more times at the walls of the quartz tube 11. However, in conjunction with the tin source 17 located within the resonator cup 10, the tin source 14 located outside the resonator cup 10 is of great advantage since it supplies additional tin vapor for increasing the tin vapor pressure within the reaction zone 5 and for compensating for the tin losses at the seals of this reaction zone.

Typical examples for carrying out the method according to the present invention, using the apparatus shown in FIGS. 1 and 2 will now be given.

EXAMPLE 1

A cup shaped niobium part for a conventional niobium cavity resonator of the $TE_{011}$ field type for an X-band frequency of 9.5 GHz, the inside diameter and inside height of which were each 41 mm, was placed in the open quartz ampoule together with the other parts shown in FIG. 2. The resonator cup (niobium, reactor quality, purity better than 99.8%) has been degassed previously at a temperature of about 2000° C in an unltrahigh vacuum. Subsequently, the inside surface of the resonator cup had been polished anodically in an electrolyte of sulfuric and fluoric acid in accordance with a procedure described in German Patent No. 2,027,156, whereby a surface layer about 100 μm thick was removed and a very smooth surface was obtained. The resonator cup was then allowed to stand in the open air in the laboratory for about 3 months and was only rinsed with acetone before being placed in the quartz ampoule 2.

After the above noted parts were put in place, the cold quartz ampoule 2 was first evacuated to a residual gas pressure of about $10^{-8}$ Torr, as measured at the pumping stem 3. The upper part 18 of the quartz tube 11 was then in an intermediate position, so that the compartment 13 as well as the interior of the reaction zone 5 were open. The cold ampoule 2 was then pushed into the furnace 1, which had already been heated to 750° C. Subsequently, the furnace 1 was heated within 30 minutes to a temperature of 1050° C. When, after about 5 minutes, the melting temperature of the tin (p.a.-quality, purity better than 99.96%) was just exceeded, the upper part 18 of the quartz tube 11 was pushed close to the resonator cup 10 by means of the actuating rod 6. The lower part of the quartz tube 11 had already been brought as close as possible to the resonator cup when it was placed in the open quartz ampoule. After being heated up, the furnace 1 was held at the temperature 1050° C for about 3.5 hours. During the entire time, the pump, connected to the open ampoule 2, was let run at the same power. Due to gas eruptions, particularly from the niobium, the pressure measured at the pumping stem 3 rose at first to about $10^{-4}$ to $10^{-5}$ Torr and then declined gradually to about $10^{-6}$ Torr. The surfaces of the tin sources 14 and 17 which were in the melted condition were each somewhat over 1 cm$^2$, i.e., a total of somewhat more than 2 cm$^2$ and thus somewhat more than 3% of the inside surface to be provided with the Nb$_3$Sn layer, of the resonator cup 10, which was 66 cm$^2$. The leakage cross section between the interior of the reaction zone 5 and the remaining part of the ampoule 2 was estimated as at most 0.5 cm$^2$, i.e., less than 25% of the surface of the tin sources, because of the unevenness of the surfaces of the niobium cup 10 and the parts 12 and 18 of the quartz tube 11, which were pushed together, still present. The seal was therefore relatively good in this case, so that it was assumed that a tin vapor pressure of about $10^{-4}$ Torr came about within the reaction zone 5.

At the end of the 3.5 hours, the upper part 18 of the tube 11 was retracted far enough that the compartment 13 containing the tin supply 14 was closed off by the quartz plate 19. Subsequently, the furnace was switched off and permitted to cool down. After about 15 minutes, i.e., at a furnace temperature of about 900° C, the ampoule 2 was gradually pulled out of the furnace step by step. Upon optical checking, the Nb$_3$Sn layer, which was produced on the inside surface of the resonator cup 10 and was about 1 to 1.5 $\mu$m thick, was found to be perfect.

Without further surface treatment, the resonator cup 10, together with a conventional coupling part of niobium, shown by way of example in FIG. 4, was then built into a cryostat with coupling lines opening into the resonator cavity from below, as described in German Pat. No. 1,164,529. Subsequently performed measurements showed a $Q_0 = 8.4 \times 10^8$ for the Nb$_3$Sn layer at a magnetic induction of 1 mT and a $Q_o = 6.8 \times 10^8$ at a magnetic flux density of 70 mT. Measurements at magnetic flux densities above 70 mT were not possible since the niobium coupler led to a breakdown of the field. At 1.5 K, the critical magnetic flux density $B_c{}^{ac}$ of the Nb$_3$Sn layer is therefore at least 70 mT. At a temperature of 4.2 K and a magnetic flux density of 1 mT, $Q_o = 6.6 \times 10^8$ was measured for the Nb$_3$Sn layer. Measurements at higher magnetic flux densities were not possible at this temperature because of the niobium coupler.

Through a one time surface treatment of the Nb$_3$Sn layer it was possible to increase the $Q_o$ still further. To this end, the Nb$_3$Sn layer was anodically oxidized in a 25-% aqueous ammonia solution with a constant current density of 10 mA/cm$^2$ until a voltage of 40V was reached between the Nb$_3$Sn layer and the cathode, which was likewise immersed in the solution. The oxide layer so formed, about 0.1 m thick, was then dissolved in approximately 40-% fluoric acid. Subsequently, the Nb$_3$Sn surface was rinsed in a hydrogen peroxide solution of about 5% and then with water. The following measurements then yielded a $Q_o$ at 1.5 K of $1.5 \times 10^9$ at a magnetic flux density of 1 mT and a $Q_o = 9.6 \times 10^8$ at a magnetic flux density of 60 mT. At 4.2 K and 1 mT, $Q_o = 1.3 \times 10^9$ was measured.

However, the shape of the reaction zone 5 can be simplified considerably over the example explained above, and in particular, quartz can be avoided as a boundary of the reaction zone. An arrangement of this nature will be explained with the aid of FIG. 3. A niobium resonator cup 21 with the dimensions given above is placed on a niobium disk 22 in the shape of a dish, which has a depression 23 for the tin supply at its center. The end face of the resonator cup 21 simply rests on the surface of the niobium disk 22. The unevenness of both surfaces has a maximum depth of about 50 $\mu$m. Thereby, a space is maintained between the two surfaces which is sufficient to evacuate the interior of the reaction zone enclosed by the parts 21 and 22. The total leakage cross section between the interior of the reaction zone and the remaining part of the reaction chamber which is formed by a vertical quartz ampoule 24, which is open at its upper end and is connected to a pump is estimated as 0.15 cm$^2$. The surface of the tin supply placed in the depression 23 may advantageously be about 2 cm$^2$ in the melted condition, i.e., about 3% of the niobium surface to be provided with the Nb$_3$Sn layer.

For the preparation of the Nb$_3$Sn layer, the tin supply is placed in the depression 23 of the niobium disk 22 and then the resonator cup 21 is placed on the niobium disk. These parts are then placed in the vertical quartz ampoule 24. A heat insulating body is furthermore provided in the upper part of the quartz ampoule 24. The evacuation of the quartz ampoule and the further reaction can then be carried out in the same manner as in the previous example. However, the reaction zone is sealed off from the beginning.

EXAMPLE 2

An Nb$_3$Sn layer about 1.5 $\mu$m thick was produced in the manner explained in connection with FIG. 3 on the inside surface of a cup shaped TE$_{011}$ niobium resonator of unannealed, undegassed, partially cold-formed niobium (reactor quality, better than 99.8% pure), of which a layer about 100 $\mu$m thick was taken off for removing a disturbed surface layer caused by the machining and for further smoothing the surface by the anodic polishing process described in the German Pat. No. 2,027,156. A measurement with the niobium coupler, taken without further surface treatment, showed a $Q_o$ of $2.33 \times 10^9$ for the Nb$_3$Sn layer at a temperature of 1.5 K and 1 mT and, shortly before reaching the critical magnetic flux density, a $Q_o$ of $1.1 \times 10^9$. The critical magnetic flux density itself was $B_c{}^{ac} = 57.5$ mT. At 4.2 K and 1 mT, $Q_o = 3.5 \times 10^8$ was measured.

The initial evacuation, for instance, can also be promoted in the arrangement shown in FIG. 3 by providing openings in the niobium disk 22, which are initially kept open and are sealed off later, e.g., after the melting of the tin supply. The sealing can be accomplished, for instance, by niobium parts which can be moved by means of suitable actuating rods. It is then advisable, of course, to extend the reaction chamber downward.

Figure 3:
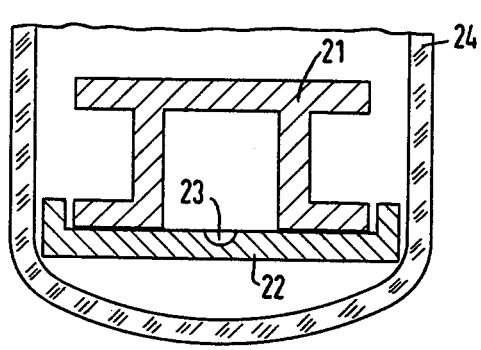
FIG. 3 is a schematic cross section through part of an apparatus for another arrangement for carrying out the method according to the present invention.

In the arrangement of FIG. 3, should the niobium parts stick to each other too fast, it is advisable to moisten them with alcohol; they can then be separated from each other after some time, using slight pressure.

Figure 4:
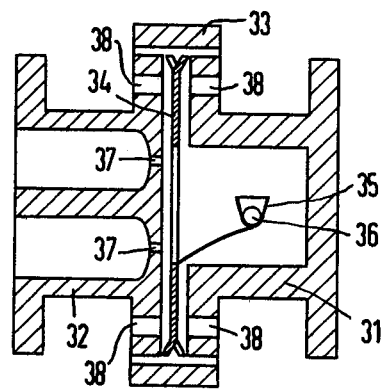
FIG. 4 is a schematic cross section through a further arrangement for carrying out the method according to the present invention.

A further arrangement, in which not only the resonator cup, but also the inside surface of a resonator cover which is facing the resonator cavity designed as a coupler 32, can be coated with Nb$_3$Sn, is shown in FIG. 4. The interior of the reaction zone is defined by the resonator cup 31, the resonator cover 32 and a niobium sleeve 33 surrounding these two parts. Between the cup 31 and the cover 32 there is further arranged a niobium ring 34 which is feathered at its outer circumference and to which a cup shaped holder 35 of niobium for a tin supply 36 is fastened. For evacuating the reaction zone shaped in this manner, in particular for evacuating the coupler, holes 37 with a diameter of about 1.5 mm and several larger holes 38 are available, which were originally intended for bolting the resonator cup 31 to the coupler 32. On the other hand, however, a sufficient seal of the reaction zone against the rest of the reaction chamber can be achieved by making the gaps between the niobium sleeve 33 or the niobium ring 34 on the one hand and the resonator parts 31 and 32 on the other hand appropriately small. The arrangement shown in FIG. 4 is particualrly well suited for coating the resonator cup and the resonator cover simultaneously with an Nb$_3$Sn layer.

Besides resonators of the TE$_{011}$ type, other resonators can also, of course, be provided with Nb$_3$Sn layers by means of the method according to the invention. For instance, resonators of the TM$_{010}$ type and, as already mentioned, resonator helices can also be coated.

What is claimed is:

1. A method for the preparation of superconductive Nb$_3$Sn layers on niobium surfaces for high frequency applications comprising:
   (a) forming a reaction zone in an evacuated reaction chamber which zone is set apart from the rest of the volume of the chamber;
   (b) disposing a quantity of essentially pure tin and the niobium surface to be provided with the Nb$_3$Sn layer in the zone;
   (c) sealing the zone off from the rest of the chamber volume, leaving a small connecting path, to the extent that while any gases present or produced within the reaction zone will be drawn off from the reaction zone when the reaction chamber is evacuated, the tin vapor pressure within the reaction zone remains higher than the tin vapor pressure in the rest of the chamber when the reaction zone is then heated;
   (d) heating the reaction zone to a temperature between 930° and 1400° C while continuously pumping the reaction chamber with a pump to evacuate it; and
   (e) holding that temperature until an Nb$_3$Sn layer with a thickness of between 0.5 and 5 μm is formed on the niobium surface.

2. The method according to claim 1, wherein the niobium surface to be provided with the Nb$_3$Sn layer is itself a boundary surface of the reaction zone.

3. The method according to claim 2, wherein the quantity of essentially pure tin is placed in a niobium cavity to coat the inside surface of the latter.

4. The method according to claim 1, wherein the reaction zone is bounded only by niobium surfaces.

5. The method according to claim 1, wherein the reaction zone is initially kept open during the step of heating and is sealed off only when an elevated temperature of about 400° C is reached.

6. The method according to claim 1, wherein the total cross section of the connecting paths between the interior of the reaction zone which is sealed off to said extent and the remainder of the reaction chamber is smaller than the surface area of the quantity of essentially pure tin.

7. The method according to claim 6, wherein the total cross section of the connecting paths is at most 25% of the surface area of the quantity of essentially pure tin.

8. The method according to claim 1, wherein the surface of the quantity of essentially pure tin is larger than 0.2% of the niobium surface to be provided with the Nb$_3$Sn layer.

9. The method according to claim 8, wherein said surface of the quantity of essentially pure tin is larger than 1% of said niobium surface.

10. The method according to claim 1, wherein the reaction chamber is evacuated and the reaction zone is heated in such a manner that a residual gas pressure of $10^{-4}$ Torr, as measured at the cold end of the reaction chamber, which is connected to the pump, is exceeded at most only for a short time.

11. The method according to claim 1 and further including disposing a body of low thermal conductivity to act as heat insulation in the reaction chamber between the reaction zone and the cold end which is connected to the pump.

* * * * *